(12) United States Patent
Schrodinger

(10) Patent No.: US 7,221,229 B2
(45) Date of Patent: May 22, 2007

(54) RECEIVER CIRCUIT HAVING AN OPTICAL RECEPTION DEVICE

(75) Inventor: Karl Schrodinger, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/821,681

(22) Filed: Apr. 9, 2004

(65) Prior Publication Data

US 2005/0168289 A1 Aug. 4, 2005

Related U.S. Application Data

(60) Provisional application No. 60/540,870, filed on Jan. 30, 2004.

(51) Int. Cl.
*H03F 3/08* (2006.01)
*H03G 3/20* (2006.01)

(52) U.S. Cl. ............ 330/308; 250/214 A; 250/214 AG

(58) Field of Classification Search ............... None
See application file for complete search history.

(56) References Cited

U.S. PATENT DOCUMENTS 6,933,786 B1 * 8/2005 Mohandas et al. ......... 330/308
6,943,630 B2 * 9/2005 Forsberg .................... 330/308
2005/0046482 A1 * 3/2005 Schrodinger ............... 330/308
2005/0052248 A1 * 3/2005 Visocchi ..................... 330/308

OTHER PUBLICATIONS

Mullrich et al.: "High-Gain Transimpedance Amplifier In InP-Based HBT Technology For The Receiver In 40-Gb/s Optical-Fiber TDM Links", IEEE Journal of Solid State Circuits, vol. 35, No. 9, Sep. 2000, pp. 1260-1265.
Kressel: "Semiconductor Devices For Optical Communication", Topics in Applied Physics, vol. 39, Springer Verlag 1982, 7 pages.

* cited by examiner

*Primary Examiner*—Robert Pascal
*Assistant Examiner*—Krista Flanagan
(74) *Attorney, Agent, or Firm*—Workman Nydegger

(57) ABSTRACT

A receiver circuit having an optical reception device and having an amplifier connected to the reception device, the amplifier also having a circuit for setting the operating point of the amplifier and also at least one control terminal of the circuit, by which the operating point of the amplifier can be selectively changed between at least two values at the user end. The receiver circuit according to the invention enables a noise optimization of the amplifier by virtue of an adjustability of the operating point of the amplifier.

21 Claims, 4 Drawing Sheets

RECEIVER CIRCUIT HAVING AN OPTICAL RECEPTION DEVICE

RELATED APPLICATION

The present application claims priority of U.S. Patent Application Ser. No. 60/540,870 filed by Karl Schrodinger on Jan. 30, 2004.

FIELD OF THE INVENTION

The invention relates to a receiver circuit having an optical reception device and having an amplifier connected downstream of the optical reception device. In particular, the invention relates to a receiver circuit having a transimpedance amplifier for optical transmission systems.

BACKGROUND OF THE INVENTION

Receiver circuit having an optical reception device are known in which light incident on the optical reception device—for example, light from an optical waveguide of an optical data transmission system—is detected by the optical reception device with formation of an electrical signal (e.g. a photocurrent) and the electrical signal is subsequently amplified by the amplifier connected downstream.

An optical receiver circuit having an optical reception device and having an amplifier connected downstream is described for example in the article "High Gain Transimpedance Amplifier in InP-Based HBT Technology for the Receiver in 40-Gb/s Optical-Fiber TDM Links" (Jens Müllrich, Herbert Thurner, Ernst Müllner, Joseph F. Jensen, Senior Member, IEEE, William E. Stanchina, Member, IEEE, M. Kardos, and Hans-Martin Rein, Senior Member, IEEE—IEEE Journal of Solid State Circuits, vol. 35, No. 9, September 2000, pages 1260 to 1265). In the case of this receiver circuit, at the input end there is a differentially operated transimpedance amplifier—that is to say a differential amplifier—connected by one input to a photodiode as reception device. The other input of the differentially operated transimpedance amplifier is connected to a DC amplifier which feeds a "correction current" into the differential amplifier for the purpose of offset correction of the photocurrent of the photodiode. The magnitude of this "correction current" that is fed in amounts to half the current swing of the photodiode during operation.

An optical receiver circuit is always subject to noise. In the case of an optical receiver circuit having a transimpedance amplifier, the most important noise sources are the input transistor of the transimpedance amplifier and the transimpedance impedance.

There is a need for receiver circuits which have a favorable noise behavior.

SUMMARY OF THE INVENTION

The invention provides a receiver circuit, which has: an optical reception device and an amplifier connected to the reception device, the amplifier having a circuit for setting the operating point of the amplifier and also at least one control terminal of the circuit, by means of which the operating point of the amplifier can be changed over between at least two values at the user end (i.e., the operating point is user configurable).

The present invention is based on the concept of providing an amplifier operating point that can be selectively changed over for the purpose of noise optimization. In this case, it is preferably the operating point of an input transistor of the amplifier that is set, the noise of which predominates over the noise of the amplifier. In this case, the noise of the input transistor can be set by way of the operating point thereof.

In a preferred refinement, the circuit for setting the operating point of the amplifier forms a setting of the operating point of the input transistor by setting the current in the input transistor. In this case, the circuit for setting the operating point of the amplifier is preferably formed between the input transistor and a reference point, at which the operating voltage is present. Changing over the current in the input transistor changes over the operating point thereof. This is accompanied by an altered noise, in which case it holds true that the noise in the input transistor likewise decreases as the current in the transistor decreases.

Preferably, the circuit for setting the operating point of the amplifier is formed by an impedance network with at least one switching device, which can be changed over at the user end by means of the at least one control terminal, the total impedance of the impedance network being altered. In particular, it is preferably provided that the impedance network has a plurality of ohmic resistors, which can be connected in and disconnected by means of the at least one switching device and the at least one control terminal.

In one development of the invention, the amplifier furthermore has at least one gain control terminal, by means of which the gain of the amplifier can be changed over at least between two gain values at the user end. This enables an optimal optical sensitivity: this is because the adjustability of the gain of the amplifier makes it possible to set the maximum gain of the amplifier depending on the prescribed bandwidth, or bandwidth to be achieved, of the receiver circuit. By way of example, on account of the approximately constant bandwidth (B)-gain (V) product (B*V=K; K results from the individual configuration of the receiver circuit), it is possible to set the maximum gain V and thus the maximum sensitivity of the receiver circuit by choosing V=K/B. The receiver circuit can thus be used optimally for different data rates. Thus, on account of the gain that can be changed over, the receiver circuit can be individually adapted for example to transmission rates of 1 Gbps (gigabit per second), 2 Gbps or 4 Gbps.

A further essential advantage of the receiver circuit with a gain that can be changed over consists in its optimal noise behavior. By way of example, if a photodiode is used as the reception device and a transimpedance amplifier is used as the amplifier, then the current noise has a particularly relevant part to play in the amplifier. However, the current noise which is attributable to the transimpedance amplifier generally becomes lower toward higher gains of the amplifier, so that, when the optimum—that is to say maximum—gain is chosen, the current noise of the amplifier also decreases. However, with other types of amplifier, too, it generally holds true that the signal-to-noise ratio becomes better in the case of a higher gain. In summary, the noise behavior of the receiver circuit can be improved further as a result of the user-end setting of the optimum gain value depending on the respective bandwidth requirement.

The amplifier preferably has a feedback impedance, which influences the gain of the amplifier. The impedance of the feedback impedance can then be set externally at the user end by means of the at least one gain control terminal. In particular, the resistance of the feedback impedance should be able to be set at the user end by means of the at least one control terminal.

In order to be able to ensure the adjustability of the impedance of the feedback impedance in a particularly simple manner, one advantageous development of the receiver circuit proposes that the feedback impedance is formed by an impedance network with at least one switching device, which can be changed over at the user end by means of the at least one control terminal and which alters the impedance or the resistance of the impedance network in the case of a changeover. In this case, the switching device is preferably formed by a switching transistor, in particular a MOS-FET transistor.

Another advantageous development of the receiver circuit proposes that the feedback impedance is formed by an impedance network with at least one variable impedance, the impedance of which can be set at the user end within a predetermined impedance range at least approximately linearly by means of the control terminal. The variable impedance may be formed for example by a transistor, in particular a MOS-FET transistor.

In transimpedance amplifiers, the bandwidth is approximately proportional to the reciprocal of the feedback impedance, that is to say to 1/feedback impedance, since the gain is proportional to the feedback impedance. In this case, the gain is determined by the so-called transimpedance (=output voltage/input current).

BRIEF DESCRIPTION OF THE DRAWINGS

The invention is explained in more detail below using an exemplary embodiment with reference to the figures, in which.

DESCRIPTION OF A PREFERRED EXEMPLARY EMBODIMENT

Figure 1:
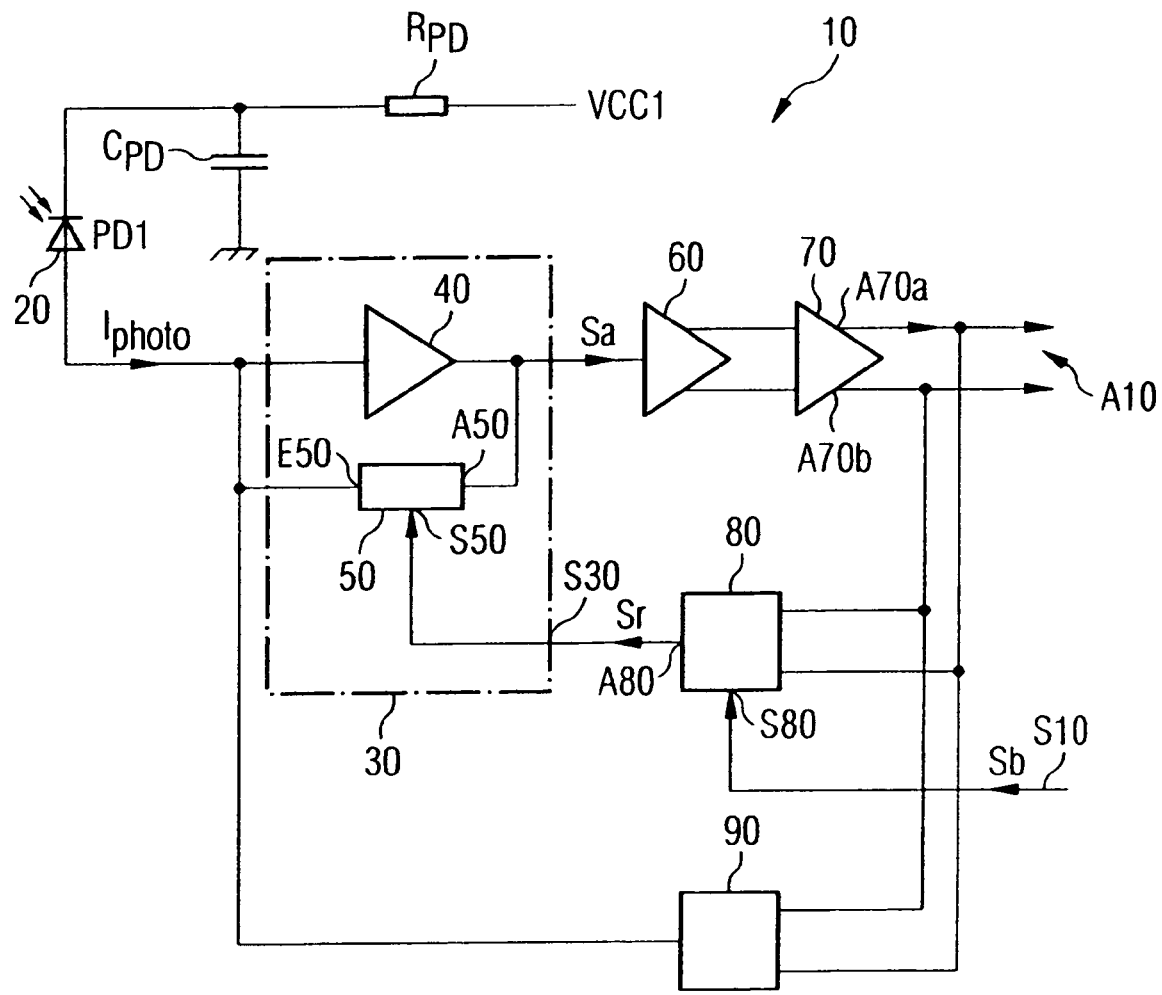
FIG. 1 shows an exemplary embodiment of a receiver circuit having an optical reception device and an amplifier connected to the reception device, said amplifier having a feedback impedance.

FIG. 1 reveals a receiver circuit 10 with a photodiode 20 as optical reception device. A transimpedance amplifier 30 is arranged downstream of the photodiode 20. The transimpedance amplifier 30 comprises a voltage amplifier 40, for example an operational amplifier, and a feedback impedance 50. The feedback impedance 50 is connected to the input end of the operational amplifier 40 by its terminal E50 and to the output end of the operational amplifier 40 by its terminal A50.

At the output end, the transimpedance amplifier 30 is additionally connected to a differential amplifier 60, which amplifies the output signal Sa of the transimpedance amplifier 30. A further amplification of the signal is effected by a second differential amplifier 70 arranged downstream of the first differential amplifier 60.

FIG. 1 furthermore reveals a control circuit 80, which, at the input end, is connected to the two outputs A70a and A70b of the second differential amplifier 70. The control circuit 80 additionally has a control input S80, via which a user-end control signal Sb can be fed into the control circuit 80. The control input S80 thus forms a control terminal S10 of the receiver circuit 10.

By an output A80, the control circuit 80 is connected to a control terminal S30 of the transimpedance amplifier 30 and thus to a control input S50 of the feedback impedance 50. Via said control input S50, the control circuit 80 can define the impedance, in particular also the resistance, of the feedback impedance 50 by means of an impedance specification signal Sr formed from the user-end control signal Sb.

Furthermore, the optical receiver circuit is equipped with a DCC circuit 90 (DCC: Duty Cycle Control), which effects a control of the optical receiver circuit. The DCC circuit 90 or the duty cycle control (offset control) formed by it controls the sampling threshold for the downstream differential amplifiers, so that the signal is sampled at the 50% value of the amplitude and, as a result, no signal pulse distortions (duty cycle) are produced. This can be effected by feeding a current into a respective one of the preamplifiers (transimpedance amplifiers) or else by feeding in a voltage at the inputs of the differential amplifiers directly.

The photodiode 20 is connected via a low-pass filter 100 formed from a capacitor $C_{PD}$ and a resistor $R_{PD}$, a supply voltage VCC1 being applied to said filter. The low-pass filter 100 serves to "filter out" possible interference signals on the supply voltage VCC.

The optical receiver circuit 10 in accordance with FIG. 1 is operated as follows:

When light is incident, a photocurrent $I_{photo}$ is generated by the photodiode 20 and fed into the transimpedance amplifier 30, where the photocurrent is amplified to form the output signal Sa. The electrical output signal Sa is amplified further by the two differential amplifiers 60 and 70 to form an amplified output signal Sa' and passes to the output A10 of the optical receiver circuit 10; the output A10 of the optical receiver circuit 10 is thus formed by the two outputs A70a and A70b of the second differential amplifier 70.

The gain of the transimpedance amplifier 30 is set at the user end by means of the control signal Sb via the control terminal S80 of the control circuit 80 or via the control terminal S10 of the receiver circuit 10. For this purpose, the control signal Sb generated at the user end passes to the control circuit 80, which, with its impedance specification signal Sr, sets the resistance of the feedback impedance 50. This is because the magnitude of the resistance (|R|) of the feedback impedance 50 directly influences the gain of the transimpedance amplifier 30 because the following holds true:

$$Sa = |R| * I_{photo}$$

Thus, in the case of the arrangement in accordance with FIG. 1, the gain of the transimpedance amplifier 30 can be prescribed at the user end by means of the control signal Sb.

When prescribing an optimum gain value for the transimpedance amplifier 30, it is necessary to take account of the bandwidth B respectively required. In concrete terms, a very large gain is possible given a very small bandwidth, whereas only a very small gain can be achieved given a very large bandwidth. In concrete terms, this is due to the fact that, to a first approximation, the bandwidth-gain product (V*B) of the receiver circuit 10 is approximately constant and is prescribed by the individual configuration of the receiver circuit. The product V*B can be determined by measurement, for example.

Thus, if a specific bandwidth is prescribed or is at least to be achieved, then the maximum permissible gain can be derived from this at the user end. A corresponding gain value is then set by the control circuit 80 through the selection of the corresponding magnitude of the feedback impedance 50.

The desired gain can therefore be prescribed at the user end via the control input S80 and thus by means of the control signal Sb. As an alternative—given a corresponding configuration of the control circuit 80—a bandwidth to be achieved can also be communicated to the control circuit 80 at the user end by means of the control signal Sb, from which the maximum permissible gain V is then determined by the control circuit 80 in accordance with the mathematical relationship mentioned above and is communicated to the transimpedance amplifier 30 via the output A80 and the control terminal S50.

In connection with FIG. 1, the user-end control signal Sb was conducted to the transimpedance amplifier 30 via the control device 80. Instead of this, the user-end control signal Sb may also be applied directly to the control terminal S30 of the transimpedance amplifier 30.

Moreover, the transimpedance amplifier 30, the two differential amplifiers 60 and 70, the control circuit 80 and the DCC circuit 90 may also be regarded as one "amplifier unit" or as one "amplifier" whose control terminal for feeding in the user-end control signal Sb is formed by the terminal S80 of the control circuit 80.

Figure 2:
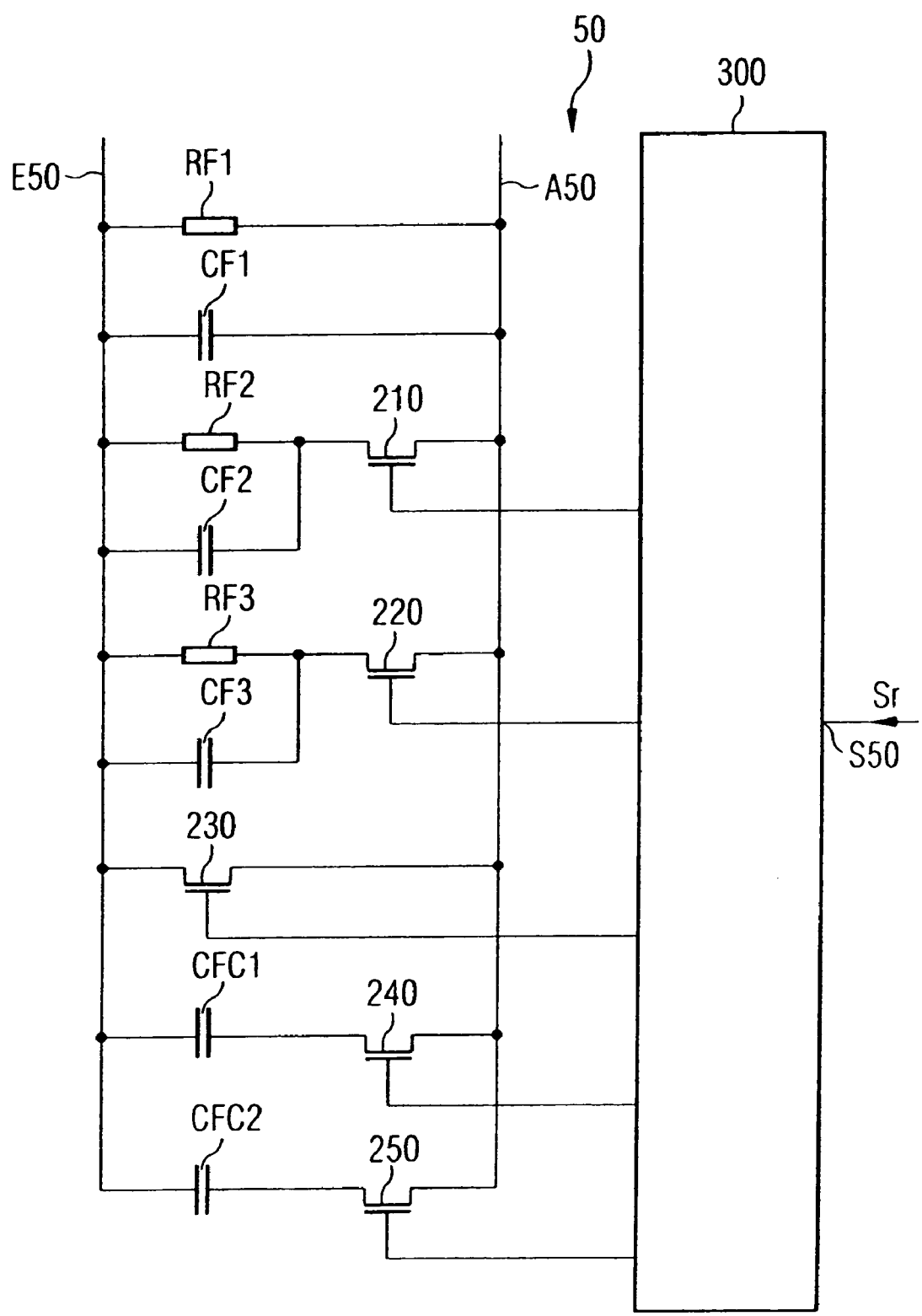
FIG. 2 shows an exemplary embodiment of the feedback impedance of the amplifier of the receiver circuit of FIG. 1.

FIG. 2 illustrates an exemplary embodiment of a feedback impedance 50 in accordance with FIG. 1. The feedback impedance is formed by user configurable impedance network. The illustration reveals an ohmic resistor RF1, with which capacitors CF1, CF2, CF3, CFC1 and CFC2 are connected in parallel. In addition, further ohmic resistors RF2 and RF3 are connected in parallel with the resistor RF1.

As can be discerned in FIG. 2, the resistor RF2 and the capacitor CF2 are connected in parallel and are connected to a switching transistor 210. If the switching transistor 210 is switched off, then the resistor RF2 and the capacitor CF2 play no part in the total impedance of the impedance network. By contrast, if the switching transistor 210 is switched on, then the resistors RF1 and RF2 form an ohmic parallel connection, with the result that the total resistance of the impedance network is reduced. The capacitor CF2 correspondingly increases the total capacitance of the impedance network since the capacitor CF2 is added to the capacitor CF1.

The resistor RF3 and the capacitor CF3 can be connected in parallel with the first resistor RF1 in a corresponding manner by means of a second switching transistor 220.

FIG. 2 furthermore reveals a MOS-FET transistor 230, which represents a linearly controllable resistor. Depending on the gate voltage applied to the MOS-FET transistor, a transistor resistor is produced which is connected in parallel with the first resistor RF1 and thus linearly reduces the total resistance of the impedance network. The resistance of the impedance network can be set in a continuously variable manner by application of the gate voltage.

Via a third switching transistor 240 and a fourth switching transistor 250, the capacitor CFC1 and the capacitor CFC2 can likewise be connected in parallel with the first resistor RF1, or else "disconnected".

FIG. 2 furthermore reveals a coding device 300, the input E300 of which forms the control terminal S50 of the feedback impedance 50 in accordance with FIG. 1. At the output end, the coding device 300 is connected to the four switching transistors 210, 220, 240 and 250 and also to the linearly operating MOS-FET transistor 230.

The coding device 300 serves to recode the impedance specification signal Sr formed by the control circuit 80 in such a way that the feedback impedance 50 or the impedance network forms the desired impedance and the transimpedance amplifier 30 thus achieves the required gain.

The impedance network is driven as follows for the operation of the receiver circuit in accordance with FIG. 1:

The resistor RF1 serves for setting the largest gain and thus the smallest bandwidth of the transimpedance amplifier 30. In this operating mode—that is to say with the smallest bandwidth—the second resistor RF2 and the third resistor RF3 are disconnected by the two switching transistors 210 and 220. The capacitor CF1 serves for compensation against oscillation tendencies of the receiver circuit 10.

If a higher data rate is required, then the second resistor RF2 is connected in, by way of example; a lower transimpedance impedance is thus produced as a result of the two resistors RF1 and RF2 being connected in parallel, as a result of which the gain of the transimpedance amplifier 30 is reduced and the bandwidth is increased.

As a result of further connection—for example of the third resistor RF3—the resistance of the feedback impedance 50 and thus the gain of the transimpedance amplifier 30 can be reduced further, as a result of which the bandwidth is increased further. The compensation capacitors CF2 and CF3 that are necessary, if appropriate, for compensation against oscillation tendencies are additionally connected in at the same time as the two resistors RF2 and RF3 by the two switching transistors 210 and 220. In this case, the transistors 210, 220, 230, 240 and 250 are changed over by the control signal SV by means of the coding device 300.

The function of the MOS-FET transistor 230, which is likewise controlled by the coding device 300 and the control circuit 80, serves primarily for amplitude control. If the output power of the transimpedance amplifier rises increasingly, then the transistor 230 is driven linearly, so that the feedback impedance (transimpedance impedance) 50 of the transimpedance amplifier 30 is continuously decreased: overdriving of the transimpedance amplifier 30 can be prevented in this way. In order to be able to identify an increase in the output power of the transimpedance amplifier 30, the control circuit 80 in accordance with FIG. 1 is connected to the output signals Sa' and −Sa' of the further differential amplifier 70.

The additional capacitors CFC1 and CFC2 can be connected in with the associated switching transistors 240 and 250 in order to avoid oscillations; this may be necessary particularly when the feedback impedance 50 of the transimpedance amplifier 30 is decreased linearly on account of the MOS-FET transistor 230.

In summary, in the case of the exemplary embodiment in accordance with FIG. 2, the feedback impedance 50 is reduced by resistors and/or capacitors being connected in "parallel". Instead of this or in addition, a changeover of the impedance of the feedback impedance 50 may also be achieved through a series circuit of connectable resistors and/or connectable capacitors.

The coding device 300 may be formed for example by an integrated circuit which correspondingly converts the impedance specification signal Sr in such a way that the transistors 210, 220, 230, 240 and 250 are driven in the manner explained above.

Figure 3:
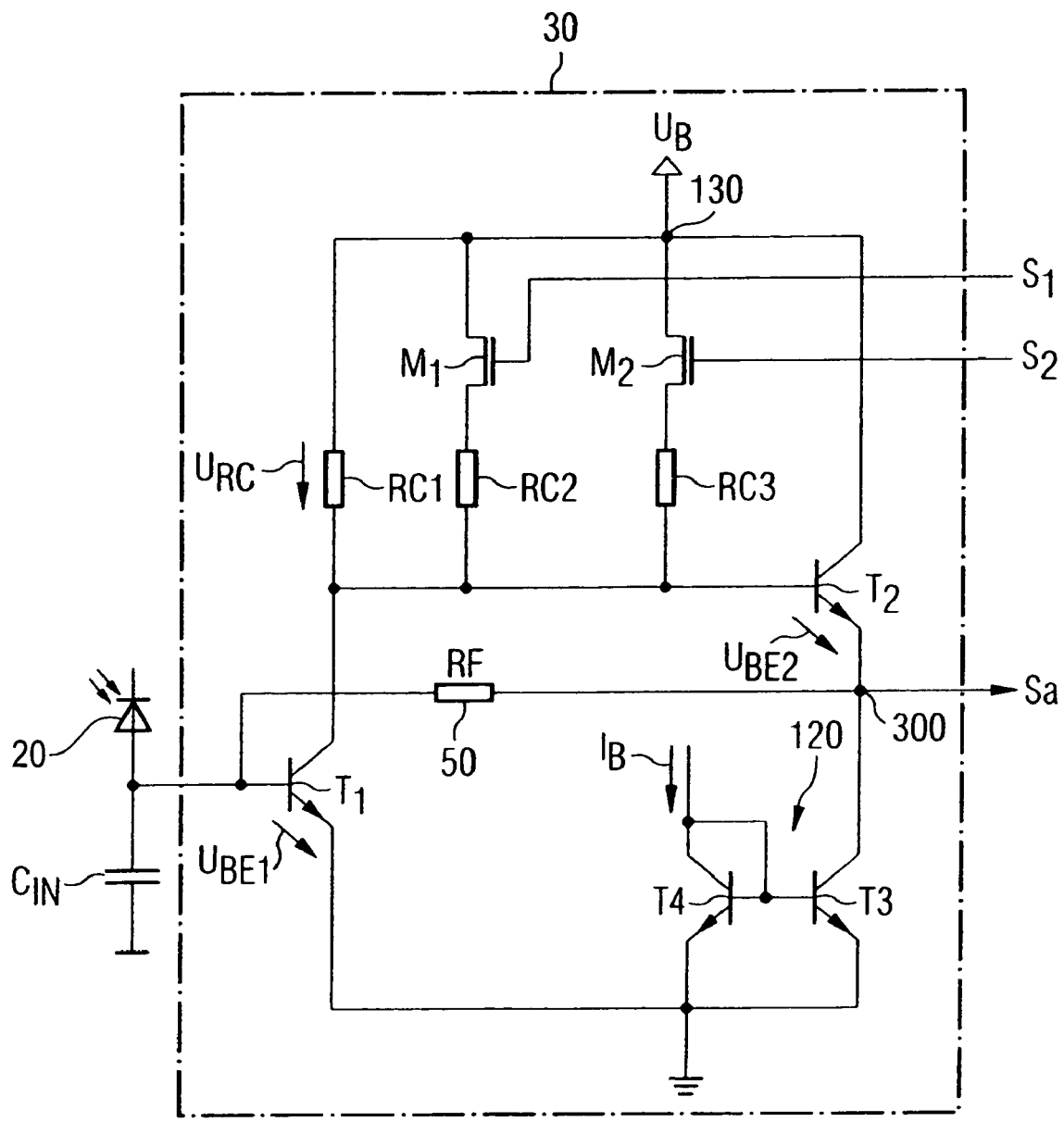
FIG. 3 shows an exemplary embodiment of the amplifier of the receiver circuit of FIG. 1.

FIG. 3 shows in detail an exemplary embodiment of the transimpedance amplifier 30 illustrated in FIG. 1. In this case, the feedback impedance 30 may be formed by an impedance network in a manner corresponding to FIG. 2. In the exemplary embodiment of FIG. 3, the output signal Sa of the transimpedance amplifier 30 is present at the reference point 300 of the circuit.

The photodiode 20 serving to detect optical signals is assigned a capacitance $C_{IN}$, which comprises the input capacitance of the photodiode 20 and also parasitic capacitances. The capacitance $C_{IN}$, together with the feedback impedance RF 50, forms a low-pass filter whose limiting frequency is determined by the equation $f=1/(2\pi C_{IN}*RF)$. As the impedance RF increases, the bandwidth of the amplifier is thus reduced, i.e. the maximum data rate which the amplifier 30 can amplify decreases as the value of the impedance RF increases.

The transistors of the amplifier 30 which are explained below are embodied using bipolar technology. However, they may also be embodied as field-effect transistors in a corresponding manner.

A first transistor T1 is present, the base (control) terminal of which is connected to the photodiode 20. The emitter (first) terminal of the transistor T1 is connected to ground. The collector (second) terminal of the transistor T1 is connected to the operating voltage $U_B$, present at a reference point 130, via a plurality of resistors $R_{C1}$, $R_{C2}$, $R_{C3}$. The resistors $R_{C1}$, $R_{C2}$, and $R_{C3}$ are connected in parallel with one another and together form resistance $R_C$. Two of the resistors $R_{C2}$ $R_{C3}$ are in this case formed such that they can be connected in or disconnected by switches M1, M2 via corresponding control terminals S1, S2. In this case, the switches M1, M2 are formed as MOS transistors, the control terminals S1, S2 being connected to the respective gate terminal. However, they may also be embodied differently.

Instead of or in addition to the resistors $R_{C1}$, $R_{C2}$, $R_{C3}$ being connected in parallel in the manner illustrated, it is possible to achieve a resistor setting of the resistor $R_C$ at the collector terminal also by means of a series circuit of connectable resistors and/or connectable capacitors.

The collector terminal of the transistor T1 is furthermore connected to the base (control) terminal of a second transistor T2. The collector (second) terminal thereof is directly connected to the operating voltage. The emitter (first) terminal of the transistor T2 is connected to ground via a mirror circuit 120 having two further transistor T3, T4. The mirror circuit 120 serves for setting a current for the transistor T2. This function may also be provided by other components, for example an ohmic resistor.

The emitter terminal of the transistor T2 is connected to the base terminal of the transistor T1 via the feedback impedance RF. An output signal Sa (cf. FIG. 1) of the amplifier 30 is tapped off at the node 300.

The circuit of FIG. 3 functions as follows:

The base-emitter voltage $U_{BE1}$ of the first transistor T1 and the base-emitter voltage $U_{BE2}$ of the second transistor T2 are approximately constant. This results from the feedback to the base terminal of the first transistors T1 via the impedance RF. Since the voltage drop $U_{RC}$ across the resistor $R_C$ (comprising one or a plurality of the parallel-connected resistors $R_{C1}$, $R_{C2}$, $R_{C3}$) depends only on the constant operating voltage $U_B$ and the two base-emitter voltages $U_{BE1}$, $U_{BE2}$ of T1 and T2, which are likewise constant to a first approximation ($U_{RC}=U_B-U_{BE1}-U_{BE2}$), the resistor $R_C$ alone determines the current in the transistor T1. In the event of supplementarily connecting or disconnecting resistors $R_{C2}$, $R_{C3}$ via the switches M1, M2, it is thus possible to set the current through the transistor T1.

As a result, the operating point of the input transistor T1 is also set insofar as the latter acquires, depending of $R_C$, a value between maximum voltage, (operating voltage $U_B$) and minimum voltage (ground). In this case, the term operating point denotes the quiescent state in the absence of an input signal. This is described by a specific point on the characteristic curve of the transistor.

The input signal of the photodiode 20 is amplified first by the transistor T1 and then by the transistor T2. The current through the transistor T2 is in this case set by the mirror circuit 120, on which a reference current $I_B$ is impressed.

Consideration shall now be given firstly to the case where the received data have a high data rate or bandwidth. A high bandwidth is accompanied by a low gain and a low value of RF. If a lower data rate is then present, the bandwidth of the amplifier may decrease. For this purpose, it is possible, on the one hand, for the value of RF to be chosen to be larger (cf FIG. 2), which leads to a larger gain and a smaller bandwidth. Furthermore, a smaller bandwidth of the amplifier may be achieved by the resistor $R_C$ between the collector terminal of the transistor T1 and the operating voltage $U_B$ being chosen to have a higher value. This is done by disconnecting one or a plurality of the parallel-connected resistors $R_{C2}$, $R_{C3}$ by means of corresponding control signals on the control terminals S1, S2.

The situation, then, is such that the noise of the amplifier 30 is determined on the one hand by the noise of the transimpedance impedance RF and on the other hand by the noise of the transistor T1 and the operating point thereof. In this case, it holds true that as the current through the transistor T1 increases, the noise also increases. These relationships are described for example in H. Kressel (Editor), Semiconductor Devices for Optical Communication, $2^{nd}$ Edition, Springer Verlag 1982, page 89 et seq.

Disconnecting one or a plurality of the resistors $R_{C2}$, $R_{C3}$ increases the total resistance $R_C$ between the collector terminal of the transistor T1 and the operating voltage. This increased total resistance $R_C$ leads to a lower current through the transistor T1 and an altered operating point of the transistor T1. Since the noise of the transistor T1 decreases as the current through the transistor T1 decreases, the noise of the amplifier 30 can be reduced in this way.

Figure 4:
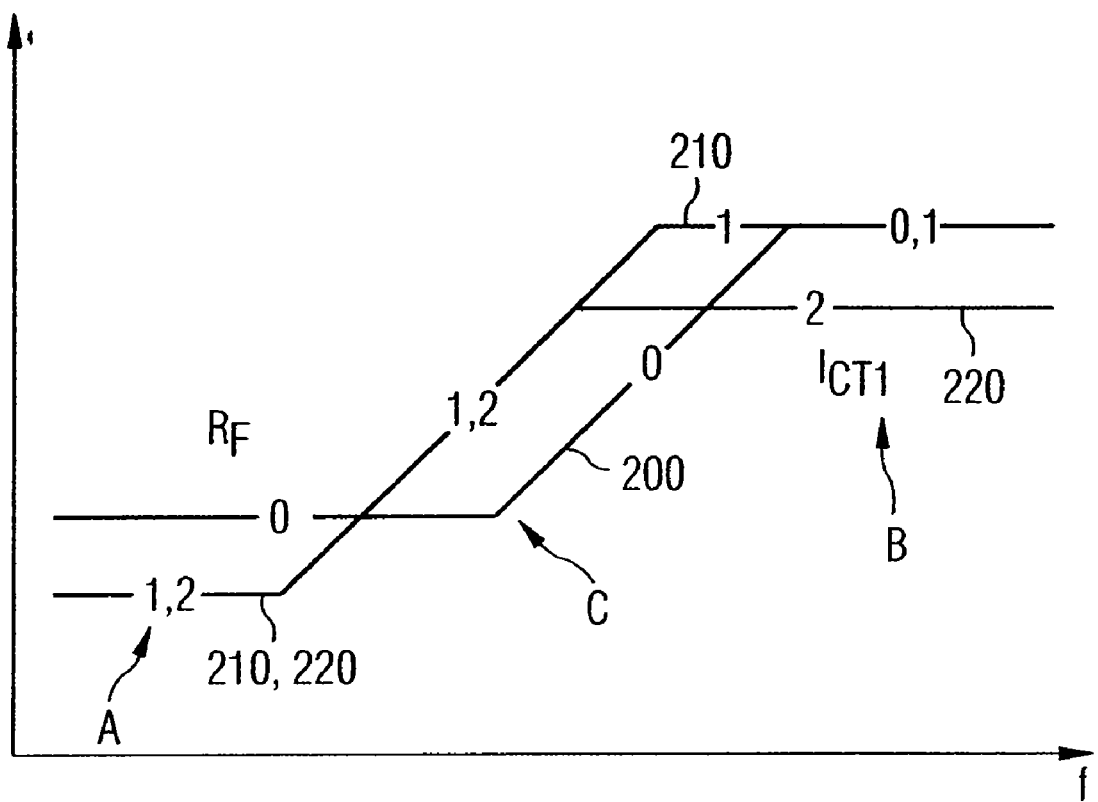
FIG. 4 shows the spectral noise power of the amplifier of FIG. 3 for three different circuit states of the amplifier.

These relationships are explained in greater detail with reference to FIG. 4. In FIG. 4, the "0" curve 200 specifies the original noise curve. The illustration shows the spectral noise power as a function of frequency. Curve 200 reveals that essentially two components make a contribution to the noise of the amplifier 30. On the one hand, at low frequencies in the region A, a contribution to the noise is made by the noise level of the feedback impedance $R_F$. The noise of the amplifier predominates at high frequencies in the region B. In between is a transition region C, in which the noise increases towards higher frequencies.

In the event of a changeover of the gain of the amplifier 30 as described in FIGS. 1 and 2, the noise level of the transimpedance impedance RF and thus the low-frequency noise component are reduced. In concrete terms, the value of the impedance RF is switched higher for the case of lower data rates. The gain of the amplifier 30 is increased in this case. At the same time, the bandwidth of the amplifier 30 is reduced, said bandwidth being approximately inversely proportional to the gain. This is connected with the fact that, at an increased value of RF, the limiting frequency of the low-pass filter comprising the capacitance $C_{IN}$ and RF decreases. Furthermore, an increase in the transimpedance impedance RF leads to a reduced noise influence of the impedance RF. Thus, the noise $<I_R^2>$ of the impedance in the transimpedance amplifier is defined as $<I_R^2>=(4\ kT/FR)\Delta f$, where k is equal to Boltzmann's constant and T specifies the temperature. At a constant temperature, the noise influence of the impedance thus decreases as the impedance increases.

This effect is illustrated in FIG. 4. The "1" curve 310, which specifies the spectral noise power after a changeover of the transimpedance impedance RF to a higher impedance, is lowered in the region of low frequencies.

A further reduction of the noise is exhibited by the "2" curve 320, which specifies the spectral noise power after the changeover of the current in the transistor T1 through disconnection of one or a plurality of the resistors $R_{C2}$, $R_{C3}$, i.e., after increasing the resistance $R_C$ in the collector arm. Increasing the resistance $R_C$ reduces the current in the transistor T1. This reduction of the current in the transistor T1 leads to a reduced noise power of the transistor T1, which is manifested in a reduced noise power of the curve 320 at high frequencies, wherein the noise power of the transistor predominates over the noise of the amplifier. At the same time, the bandwidth of the amplifier is also reduced in the case of a resistance $R_C$ having a higher value. This effect also takes place, as explained, when the transimpedance impedance RF is increased.

Consequently, an amplifier circuit 30 is described which provides a noise optimization of the amplifier on the one hand by means of a changeover of the gain of the amplifier 30 (and thus a changeover of the bandwidth of the amplifier 30) and on the other hand by means of an operating point changeover in the input transistor T1 of the amplifier 30 at lower data rates.

The configuration of the invention is not restricted to the exemplary embodiments present above, which are to be understood merely by way of example. The person skilled in the art recognizes that numerous alternative embodiment variants exist which, despite their deviation from the exemplary embodiments described, make use of the teaching defined in the claims below.

The invention claimed is:

1. A receiver circuit comprising:
an optical reception device; and
an amplifier connected to the reception device, wherein the amplifier includes:
a circuit for setting the operating point of the amplifier, and also
at least one control terminal of the circuit, by which an operating point of the amplifier is configured to be changed between at least two values at the user end by a user.

2. The receiver circuit as claimed in claim 1, wherein the amplifier further includes an input transistor, and wherein the circuit for setting the operating point of the amplifier includes means for setting an operating point of the input transistor.

3. The receiver circuit as claimed in claim 2, wherein the circuit for setting the operating point of the amplifier includes means for forming a setting of the operating point of the input transistor by setting a current in the input transistor.

4. The receiver circuit as claimed in claim 3, wherein the circuit for setting the operating point of the amplifier is coupled between the input transistor and a reference point, at which the operating voltage is present.

5. The receiver circuit as claimed in claim 3, wherein the circuit for setting the operating point of the amplifier comprises an impedance network with at least one switching device, which can be changed over by a control signal applied to the at least one control terminal, thereby altering the total impedance of the impedance network.

6. The receiver circuit as claimed in claim 5, wherein the impedance network includes a plurality of ohmic resistors which can be connected in and disconnected by means of the at least one switching device and the at least one control terminal.

7. The receiver circuit as claimed in claim 6, wherein the switching device comprising a switching transistor.

8. The receiver circuit as claimed in claim 1, wherein the amplifier further comprises at least one terminal, by which the gain of the amplifier over at least between two gain values at the gain control can be changed user end.

9. The receiver circuit as claimed in claim 8, wherein the amplifier comprises a transimpedance amplifier.

10. The receiver circuit as claimed in claim 9, wherein the amplifier includes a feedback impedance, which influences the gain of the amplifier.

11. The receiver circuit as claimed in claim 10, it being possible for the impedance of the feedback impedance to be set at the user end by means of the at least one gain control terminal.

12. The receiver circuit as claimed in claim 11, it being possible for the resistance of the feedback impedance to be set at the user end by means of the at least one gain control terminal.

13. The receiver circuit as claimed in claim 10, wherein the feedback impedance comprises an impedance network including at least one switching device, which can be changed over at the user end by the at least one gain control terminal and which alters the impedance of the feedback impedance in the event of changeover.

14. The receiver circuit as claimed in claim 13, wherein the switching device comprises a switching transistor.

15. The receiver circuit as claimed in claim 10, wherein the feedback impedance comprises an impedance network including at least one variable impedance, the impedance of which can be set within a predetermined impedance range at least approximately linearly at the user end by means of the gain control terminal.

16. The receiver circuit as claimed in claim 15, wherein the variable impedance comprises a transistor.

17. The receiver circuit as claimed in claim 1, further comprising a photodiode.

18. A receiver circuit comprising:
an optical reception device for generating a data signal in response to a received optical signal;
an amplifier circuit comprising:
a first transistor having a control terminal connected to receive the data signal from the optical reception device, a first terminal coupled to ground, and a second terminal,
a second transistor having a control terminal connected to the second terminal of the first transistor, a first terminal coupled to the control terminal of the first transistor, and a second terminal coupled to an operating voltage source,
a first configurable impedance network connected between the control terminal of the first transistor and the second terminal of the second transistor, and
a second configurable impedance network connected between the operating voltage source and the second terminal of the first transistor; and means for controlling the first and second configurable impedance networks such that, in a first operating mode, the first configurable impedance network generates a relatively high impedance and the second configurable impedance network generates a relatively low impedance, and in a second operating mode, the first configurable impedance network generates a relatively low impedance and the second configurable impedance network generates a relatively high impedance.

19. The receiver circuit according to claim 18, wherein the first configurable impedance network comprises:
- a first terminal connected to the second terminal of the second transistor;
- a second terminal connected to the control terminal of the first transistor;
- a first impedance element connected between the first and second terminals; and
- a second impedance element and a pass transistor connected in series between the first and second terminals, and
- wherein said controlling means comprises means for selectively turning off the pass transistor during the first operating mode, and for turning on the pass transistor during the second operating mode.

20. The receiver circuit according to claim 18, wherein the second configurable impedance network comprises:
- a first impedance element connected between the operating voltage source and the second terminal of the first transistor; and
- a second impedance element and a pass transistor connected in series between the operating voltage source and the second terminal of the first transistor, and
- wherein said controlling means comprises means for selectively turning on the pass transistor during the first operating mode, and for turning off the pass transistor during the second operating mode.

21. The receiver circuit according to claim 18, wherein the amplifier circuit further comprises a mirror circuit connected between the first terminal of the second transistor and ground.

* * * * *

UNITED STATES PATENT AND TRADEMARK OFFICE
CERTIFICATE OF CORRECTION

| | | |
|---|---|---|
| PATENT NO. | : 7,221,229 B2 | |
| APPLICATION NO. | : 10/821681 | |
| DATED | : May 22, 2007 | |
| INVENTOR(S) | : Schrodinger | |

It is certified that error appears in the above-identified patent and that said Letters Patent is hereby corrected as shown below:

Delete Title page illustrating a figure, and substitute therefor, new Title page illustrating a figure. (attached)

United States Patent
Schrodinger

(10) Patent No.: US 7,221,229 B2
(45) Date of Patent: May 22, 2007

(54) RECEIVER CIRCUIT HAVING AN OPTICAL RECEPTION DEVICE

(75) Inventor: Karl Schrodinger, Berlin (DE)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 10/821,681

(22) Filed: Apr. 9, 2004

(65) Prior Publication Data
US 2005/0168289 A1 Aug. 4, 2005

Related U.S. Application Data

(60) Provisional application No. 60/540,870, filed on Jan. 30, 2004.

(51) Int. Cl.
*H03F 3/08* (2006.01)
*H03G 3/20* (2006.01)

(52) U.S. Cl. ............ 330/308; 250/214 A; 250/214 AG

(58) Field of Classification Search .................. None
See application file for complete search history.

(56) References Cited

U.S. PATENT DOCUMENTS

| | | | |
|---|---|---|---|
| 6,933,786 B1* | 8/2005 | Mohandas et al. ........ 330/308 |
| 6,943,630 B2* | 9/2005 | Forsberg ................ 330/308 |
| 2005/0046482 A1* | 3/2005 | Schrodinger ............ 330/308 |
| 2005/0052248 A1* | 3/2005 | Visocchi .............. 330/308 |

OTHER PUBLICATIONS

Mullrich et al.: "High-Gain Transimpedance Amplifier In InP-Based HBT Technology For The Receiver In 40-Gb/s Optical-Fiber TDM Links", IEEE Journal of Solid State Circuits, vol. 35, No. 9, Sep. 2000, pp. 1260-1265.
Kressel: "Semiconductor Devices For Optical Communication", Topics in Applied Physics, vol. 39, Springer Verlag 1982, 7 pages.

* cited by examiner

*Primary Examiner*—Robert Pascal
*Assistant Examiner*—Krista Flanagan
(74) *Attorney, Agent, or Firm*—Workman Nydegger

(57) ABSTRACT

A receiver circuit having an optical reception device and having an amplifier connected to the reception device, the amplifier also having a circuit for setting the operating point of the amplifier and also at least one control terminal of the circuit, by which the operating point of the amplifier can be selectively changed between at least two values at the user end. The receiver circuit according to the invention enables a noise optimization of the amplifier by virtue of an adjustability of the operating point of the amplifier.

21 Claims, 4 Drawing Sheets

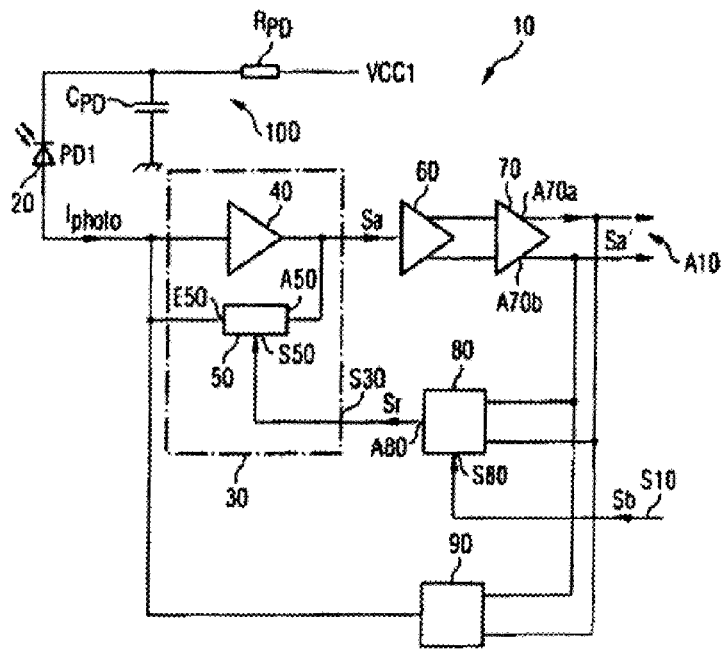

UNITED STATES PATENT AND TRADEMARK OFFICE
CERTIFICATE OF CORRECTION

PATENT NO. : 7,221,229 B2
APPLICATION NO. : 10/821681
DATED : May 22, 2007
INVENTOR(S) : Schrodinger It is certified that error appears in the above-identified patent and that said Letters Patent is hereby corrected as shown below:

Drawings
Sheet 1, replace Figure 1 with the figure depicted herein below, in which the "low-pass filter" has been labeled with --100-- and the "amplified output signal" has been labeled with --Sa'--

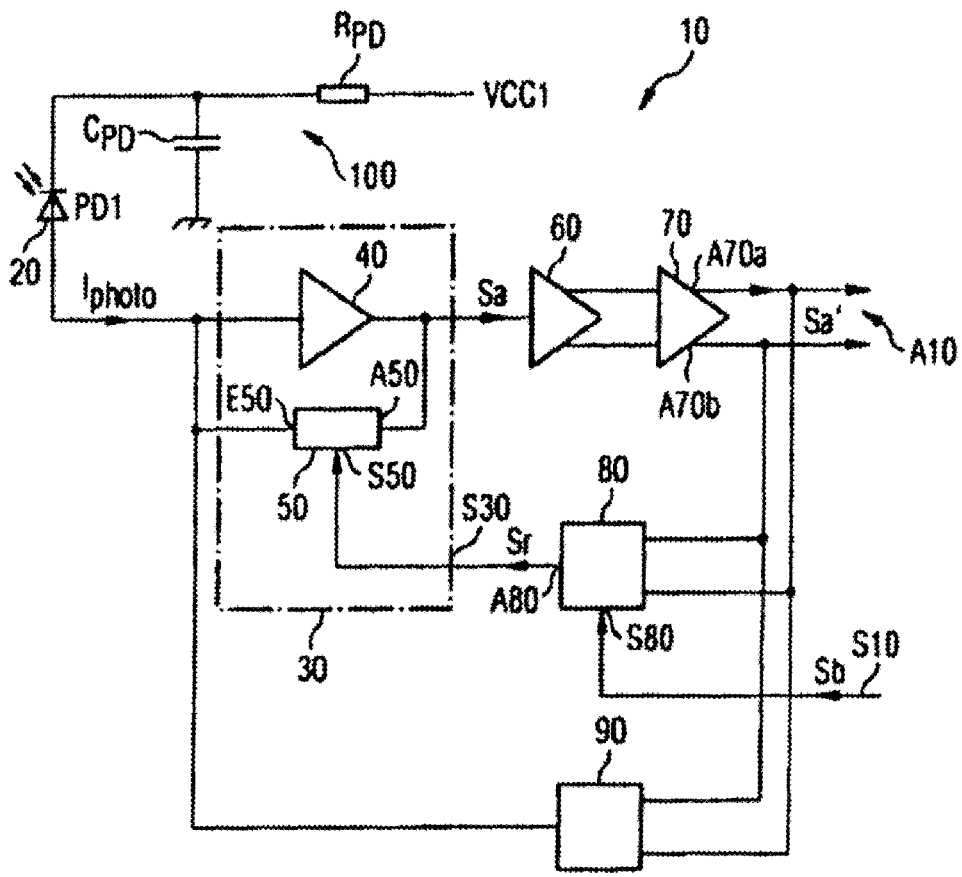

Fig. 1

UNITED STATES PATENT AND TRADEMARK OFFICE
CERTIFICATE OF CORRECTION

PATENT NO.       : 7,221,229 B2
APPLICATION NO.  : 10/821681
DATED            : May 22, 2007
INVENTOR(S)      : Schrodinger It is certified that error appears in the above-identified patent and that said Letters Patent is hereby corrected as shown below:

Column 7
Line 36, change "transistor" to --transistors--

Column 8
Line 64, change "310" to --210--

Column 9
Line 2, change "320" to --220--
Line 9, change "320" to --220--

Signed and Sealed this

Twenty-sixth Day of August, 2008

JON W. DUDAS
*Director of the United States Patent and Trademark Office*